US010378096B2

United States Patent
Clark et al.

(12) United States Patent
(10) Patent No.: US 10,378,096 B2
(45) Date of Patent: *Aug. 13, 2019

(54) METHODS OF FORMING A MULTILAYER THERMAL BARRIER COATING SYSTEM

(71) Applicant: General Electric Company

(72) Inventors: Michael David Clark, Liberty Township, OH (US); Douglas Gerard Konitzer, West Chester, OH (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/487,724

(22) Filed: Apr. 14, 2017

(65) Prior Publication Data

US 2017/0314119 A1 Nov. 2, 2017

Related U.S. Application Data

(63) Continuation of application No. 15/140,822, filed on Apr. 28, 2016, now Pat. No. 9,657,387.

(51) Int. Cl.

| | |
|---|---|
| ***C23C 14/30*** | (2006.01) |
| ***C23C 14/22*** | (2006.01) |
| ***C23C 28/00*** | (2006.01) |
| ***C23C 14/06*** | (2006.01) |

(Continued)

(52) U.S. Cl.

CPC .......... *C23C 14/221* (2013.01); *C23C 14/025* (2013.01); *C23C 14/06* (2013.01); *C23C 14/28* (2013.01); *C23C 14/30* (2013.01); *C23C 28/00* (2013.01); *C23C 28/321* (2013.01);

(Continued)

(58) Field of Classification Search

CPC ..... C23C 14/225; C23C 14/228; C23C 14/30; C23C 16/487

See application file for complete search history.

(56) References Cited

U.S. PATENT DOCUMENTS

| | | | |
|---|---|---|---|
| 5,350,599 | A | 9/1994 | Rigney et al. |
| 5,834,070 | A | 11/1998 | Movchan et al. |

(Continued)

FOREIGN PATENT DOCUMENTS

| | | | |
|---|---|---|---|
| WO | 2004/011688 | A2 | 2/2004 |

OTHER PUBLICATIONS

Movchan, B.A., et al., "Graded thermal barrier coatings, deposited by EB-PVD". Surface & Coatings Technology 188-189 (2004) 85-92.*

(Continued)

*Primary Examiner* — Bret P Chen

(74) *Attorney, Agent, or Firm* — Dority & Manning, P.A.

(57) ABSTRACT

Methods are provided for forming a thermal barrier coating system on a surface of a component. The method can include introducing the component into a coating chamber, where a first ceramic source material and a second ceramic source material are positioned within the coating chamber of a physical vapor deposition apparatus. An energy source is directed onto the first ceramic source material to vaporize the first ceramic source material to deposit a first layer on the component. The energy source is alternated between the first ceramic source material and the second ceramic source material to form a blended layer on the first layer.

8 Claims, 7 Drawing Sheets

INTRODUCING A COMPONENT INTO A COATING CHAMBER — 102

DIRECTING AN ENERGY SOURCE ONTO A FIRST CERAMIC SOURCE MATERIAL TO DEPOSIT A FIRST LAYER ON THE COMPONENT — 104

ALTERNATING ENERGY SOURCE BETWEEN THE FIRST CERAMIC SOURCE MATERIAL AND A SECOND CERAMIC SOURCE MATERIAL TO FORM A BLENDED LAYER — 106

DIRECTING THE ENERGY SOURCE ONTO THE SECOND CERAMIC SOURCE MATERIAL TO DEPOSIT A SECOND LAYER — 108

(51) Int. Cl.
*C23C 14/02* (2006.01)
*C23C 14/28* (2006.01)

(52) U.S. Cl.
CPC ........ *C23C 28/3215* (2013.01); *C23C 28/345* (2013.01); *C23C 28/3455* (2013.01)

(56) References Cited

U.S. PATENT DOCUMENTS

| | | | | |
|---|---|---|---|---|
| 6,001,492 | A * | 12/1999 | Jackson | B32B 15/04 416/241 B |
| 6,521,293 | B1 | 2/2003 | Kojima | |
| 6,541,075 | B2 | 4/2003 | Hasz et al. | |
| 6,620,465 | B2 | 9/2003 | Rigney et al. | |
| 6,720,038 | B2 | 4/2004 | Darolia et al. | |
| 6,808,761 | B2 | 10/2004 | Chaput et al. | |
| 7,569,251 | B2 * | 8/2009 | Saint-Ramond | C23C 14/00 427/255.32 |
| 7,838,083 | B1 * | 11/2010 | Youchison | C23C 14/024 427/528 |
| 9,657,387 | B1 * | 5/2017 | Clark | C23C 28/00 |
| 2002/0004105 | A1 * | 1/2002 | Kunze | B22F 3/1055 427/586 |
| 2002/0110698 | A1 * | 8/2002 | Singh | C23C 14/083 428/472 |
| 2005/0013994 | A1 * | 1/2005 | Strangman | C23C 4/18 428/336 |
| 2005/0208337 | A1 * | 9/2005 | Ulion | C23C 14/06 428/698 |
| 2005/0221109 | A1 * | 10/2005 | Torigoe | B32B 15/04 428/633 |
| 2007/0160873 | A1 * | 7/2007 | Freling | C23C 4/02 428/701 |
| 2008/0026242 | A1 * | 1/2008 | Quadakkers | C23C 8/10 428/551 |
| 2008/0113218 | A1 * | 5/2008 | Schlichting | C04B 35/01 428/701 |
| 2009/0017260 | A1 * | 1/2009 | Kulkarni | C23C 4/18 428/161 |
| 2009/0169752 | A1 | 7/2009 | Fu et al. | |
| 2010/0136323 | A1 * | 6/2010 | Varanasi | F01M 11/0004 428/319.1 |
| 2011/0151270 | A1 * | 6/2011 | Rockstroh | C23C 4/11 428/550 |
| 2011/0200822 | A1 | 8/2011 | Detavernier et al. | |
| 2011/0281107 | A1 | 11/2011 | Gero et al. | |
| 2011/0300357 | A1 * | 12/2011 | Witz | C23C 4/02 428/213 |
| 2012/0225209 | A1 * | 9/2012 | Bishop | C23C 8/04 427/282 |
| 2013/0129938 | A1 | 5/2013 | Hass | |
| 2013/0189441 | A1 * | 7/2013 | Pabla | C23C 4/12 427/453 |
| 2014/0261080 | A1 | 9/2014 | Lee | |
| 2015/0315090 | A1 * | 11/2015 | Bruck | C04B 41/45 428/313.3 |

OTHER PUBLICATIONS

Clarke, David R., et al., “Thermal barrier coating materials”. Materials Today, Jun. 2005, pp. 22-29.*

Hass, D.D., et al., “Electron beam directed vapor deposition of thermal barrier coatings”. J. Vac. Sci. Technol. A 16(6), Nov./Dec. 1998, pp. 3396-3401.*

Movchan, B.A., et al., “High-Temperature Protective Coatings Produced by EB-PVD”. Journal of Coating Science and Technology, 2014, 1, 96-110.*

Soares de Almeida, Daniel, et al., “Thermal barrier coating by electron beam-physical vapor deposition of zirconia co-doped with yttria and niobia”. J. Aerosp. Technol. Manag., Sao Jose dos Campos, vol. 2, No. 2, pp. 195-202, May-Aug. 2010.*

Extended European Search Report and Opinion issued in connection with corresponding EP Application No. 17162787.0 dated Oct. 9, 2017.

Bobzin, K., et al., “Thermal cycling behavior of Yttria Stabilized Zirconia and Lanthanum Zirconate as graded and bilayer EB-PVD thermal barrier coatings,” High Temperature Material Processes, vol. 10, Issue 1, pp. 103-116 (Jan. 2006).

Krell, T. et al., “Graded EB-PVD Alumina-Zirconia Thermal Barrier Coatings—An Experimental Approach,” Materials Science Forum, vol. 308-311, pp. 396-401 (May 17, 1999).

Schulz, U., et al., “Graded design of EB-PVD thermal barrier coatings system,” Proceedings of AGARD Workshop on Thermal Barrier Coatings, pp. 16-1-16-10 (Oct. 17, 1997).

Office Action issued in connection with corresponding CA Application No. 2964118 dated Apr. 11, 2018.

Bobzin, K., et al., “Thermal cycling behavior of Yttria Stabilized Zirconia and Lanthanum Zirconate as graded and bilayer EB-PVD thermal barrier coatings,” High Temperature Material Processes, vol. 10, Issue 1, pp. 103-116 (2006).

Krell, T., et al., “Graded EB-PVD Alumina-Zirconia Thermal Barrier Coatings—An Experimental Approach,” Material-Science Forum, vol. 308-311, pp. 396-401 (May 17, 1999).

Schulz, U., et al., “Graded design of EB-PVD thermal barrier coatings system,” Proceedings of AGARD Workshop on Thermal Barrier Coatings, pp. 1-10 (Oct. 1997).

Machine Translation and First Office Action and search issued in connection with corresponding CN Application No. 201710294621.9 dated Jan. 4, 2019.

Office Action issued in connection with corresponding CA Application No. 2964118 dated Jan. 7, 2019.

Non-Final Rejection towards U.S. Appl. No. 15/487,533 dated Jan. 10, 2019.

* cited by examiner

METHODS OF FORMING A MULTILAYER THERMAL BARRIER COATING SYSTEM

CROSS REFERENCE TO RELATED APPLICATION

This Application is a continuation of U.S. patent application Ser. No. 15/140,822, entitled "SYSTEM AND METHODS OF FORMING A MULTILAYER THERMAL BARRIER COATING SYSTEM," filed 28 Apr. 2016, now U.S. Pat. No. 9,657,387, which is herein incorporated by reference.

FIELD OF THE INFORMATION

This invention generally relates to systems and methods for forming coatings on components exposed to high temperatures, such as the hostile thermal environment of a gas turbine engine. More particularly, this invention is directed to a method of forming a multi-layered thermal barrier coating.

BACKGROUND OF THE INVENTION

Hot section components of gas turbine engines are often protected by a thermal barrier coating (TBC), which reduces the temperature of the underlying component substrate and thereby prolongs the service life of the component. Ceramic materials and particularly yttria-stabilized zirconia (YSZ) are widely used as TBC materials because of their high temperature capability, low thermal conductivity, and relative ease of deposition by plasma spraying, flame spraying and physical vapor deposition (PVD) techniques. Air plasma spraying (APS) has the advantages of relatively low equipment costs and ease of application and masking, while TBC's employed in the highest temperature regions of gas turbine engines are often deposited by PVD, particularly electron-beam PVD (EBPVD), which yields a strain-tolerant columnar grain structure. Similar columnar microstructures can be produced using other atomic and molecular vapor processes.

Observed failure mechanisms in turbine multi-layer systems are often anchored around interfacial challenges between the surface of the component and the TBC and/or different layers of the TBC. Such issues, including surface contamination, process inhomogeneity during start-up (e.g. inter-layer porosity, unmelts, etc.), and source cross-contamination can lead to interfaces with unreliable functionality, thereby endangering the multi-layer system's stability.

Thus, a need exists for multi-layered coating systems where individual layers can provide improvements to the coating system's damage tolerance, thermal properties, reactivity, etc.

BRIEF DESCRIPTION OF THE INVENTION

Aspects and advantages of the invention will be set forth in part in the following description, or may be obvious from the description, or may be learned through practice of the invention.

Methods are generally provided for forming a thermal barrier coating system on a surface of a component. The thermal barrier coating system generally includes a thermal barrier coating that has columnar grains. In one embodiment, the method includes introducing the component into a coating chamber, where a first ceramic source material and a second ceramic source material are positioned within the coating chamber of a physical vapor deposition apparatus. An energy source is directed onto the first ceramic source material to vaporize the first ceramic source material to deposit a first layer on the component. The energy source is alternated between the first ceramic source material and the second ceramic source material to form a blended layer on the first layer, with the blended layer being formed from vapors from the first ceramic source material and the second ceramic source material.

In certain embodiments, after alternating the energy source between the first ceramic source material and the second ceramic source material, the energy source is directed onto the second ceramic source material to vaporize the second ceramic source material to deposit a second layer on the blended layer such that the blended layer is positioned between the first layer and the second layer.

A thermal barrier coating system is also generally provided, which can be formed on a surface of a substrate according to such methods described above. In one embodiment, the thermal barrier coating system includes a bond coating on the surface of the substrate; a first layer on the bond coating and formed from a first ceramic material; a blended layer on the first layer and formed from the first ceramic material and a second ceramic material that is different from the first ceramic material; and a second layer on the blended layer and formed from the second ceramic material. Generally, the blended layer includes a granular interface between the first layer and the second layer.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended Figs., in which.

Figure 1:
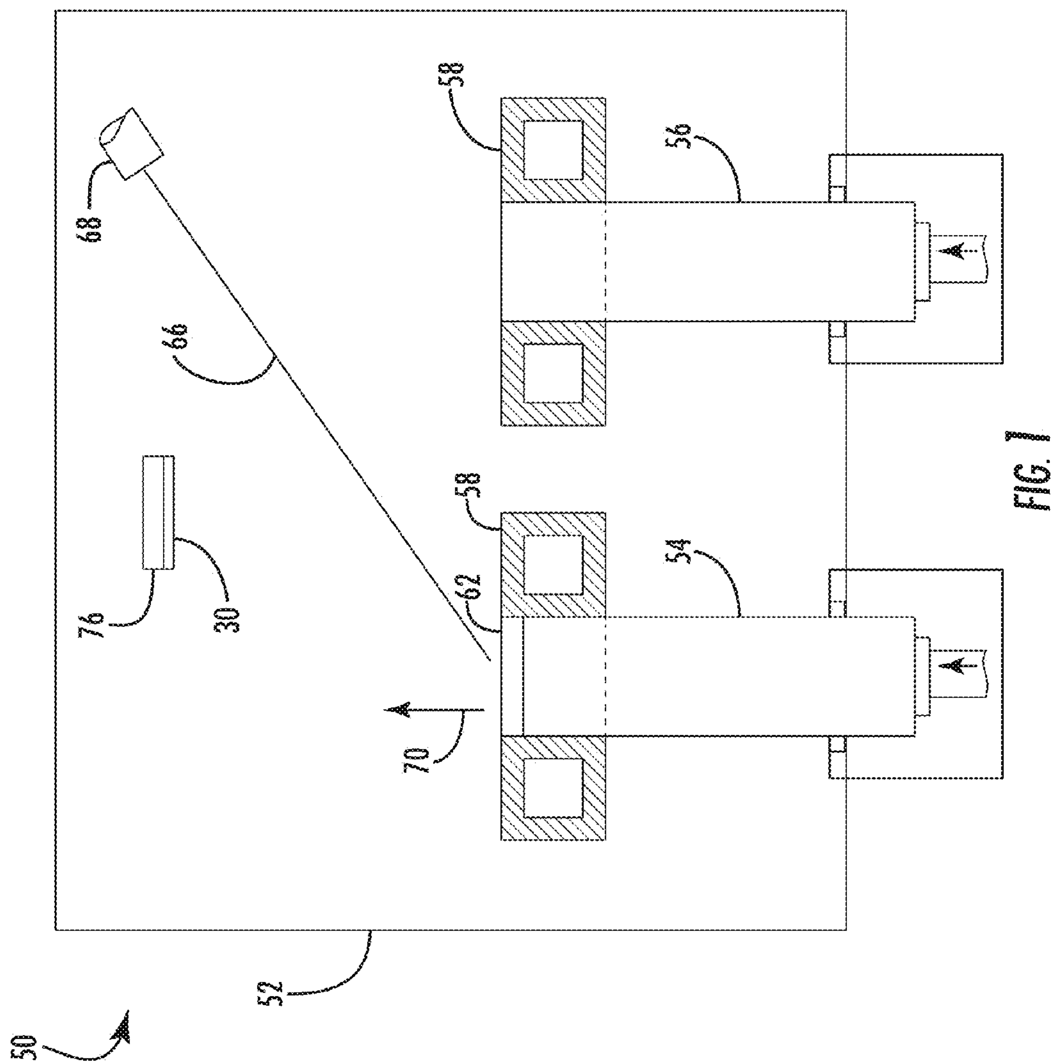
FIG. 1 shows a general schematic of a cross-sectional view of an exemplary electron beam physical vapor deposition apparatus for use in depositing a first layer of a thermal barrier coating system.

Repeat use of reference characters in the present specification and drawings is intended to represent the same or analogous features or elements of the present invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first", "second", and "third" may be used interchangeably to distinguish one component from another and are not intended to signify location or importance of the individual components.

The terms "upstream" and "downstream" refer to the relative direction with respect to fluid flow in a fluid pathway. For example, "upstream" refers to the direction from which the fluid flows, and "downstream" refers to the direction to which the fluid flows.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer.

Systems and methods are generally provided for a single-step deposition utilizing multi-sources such that individual layers of unique chemistries can be deposited from different sources without interrupting the deposition process. These systems and methods allow the layer ordering and interfacial transitions to be tailed as desired, while mitigating prevalent interfacial issues such as contamination and process inhomogeneity (e.g. inter-layer porosity, unmelts, etc.). Thus, robust interfaces can be constructed maximizing the benefits of the coating system. Additionally, it is possible to include as many layers of varying composition with any periodicity that is desired. For example, a two pool system is shown and described with respect to FIGS. 1-3 for varying two compositions; however, with advanced machines additional pools may be included as desired to form layered TBC's with any system of layers and compositions. For example, 2 sources to about 5 sources can be included in the deposition chamber. The layered compositions provide a commercial advantage in that they allow the desire of more durable TBC's which provides improved cooling for turbine components.

Figure 4:
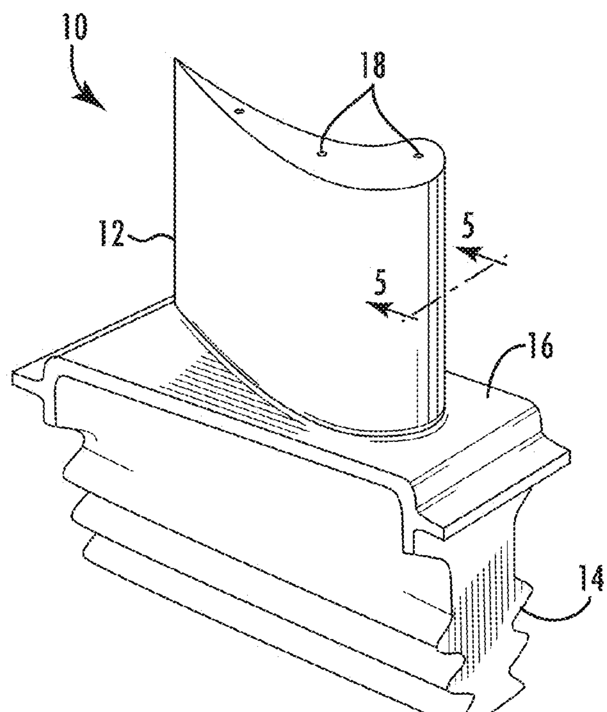
FIG. 4 shows a perspective view of an exemplary high pressure turbine blade.

Embodiments of the thermal barrier coating system described here are described in reference to a high pressure turbine blade 10 shown in FIG. 4. However, the present disclosure is generally applicable to any component that operates within a thermally and chemically hostile environment. The blade 10 generally includes an airfoil 12 against which hot combustion gases are directed during operation of the gas turbine engine, and whose surfaces are therefore subjected to severe attack by oxidation, hot corrosion and erosion. The airfoil 12 is anchored to a turbine disk (not shown) with a dovetail 14 formed on a root section 16 of the blade 10. Cooling holes 18 are present in the airfoil 12 through which bleed air is forced to transfer heat from the blade 10.

Figure 5:
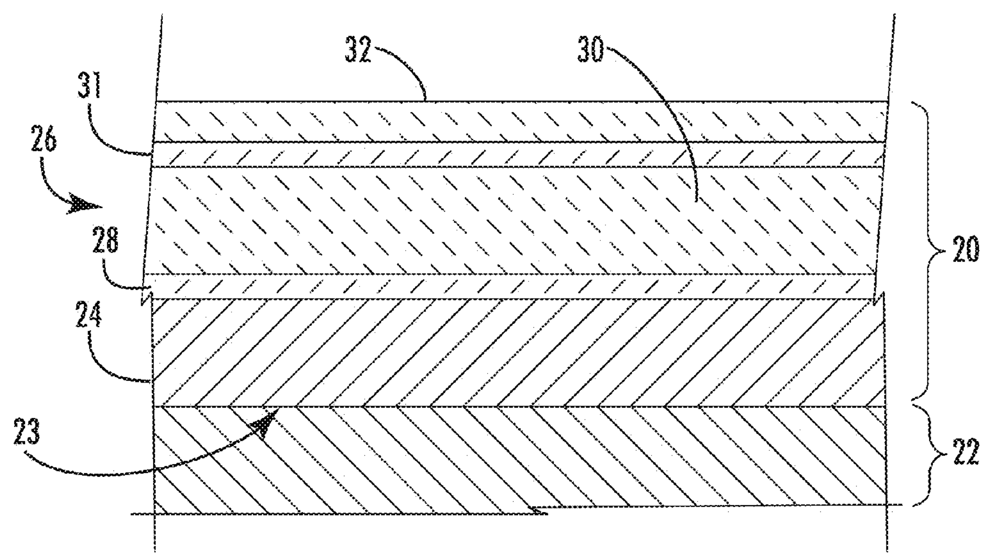
FIG. 5 shows an exemplary cross-sectional view of the blade of FIG. 4, which shows an exemplary thermal barrier coating system in accordance with one embodiment of the present disclosure.

The surface of the airfoil 12 is protected by a TBC system 20, represented in FIG. 5 as including a metallic bond coat 24 that overlies the surface 23 of a substrate 22, which may be a superalloy and typically the base material of the blade 10. The bond coat 24 is, in particular embodiments, an aluminum-rich composition, such as an overlay coating of a MCrAlX alloy or a diffusion coating such as a diffusion aluminide or a diffusion platinum aluminide. Alternatively, overlay coatings of beta-phase nickel aluminide (βNiAl) intermetallic can be used as the bond coat 24. Such aluminum-rich bond coats develop an aluminum oxide (alumina) scale 28, which is grown by oxidation of the bond coat 24. The alumina scale 28 chemically bonds a thermal-insulating TBC 26 to the bond coat 24 and substrate 22. The TBC 26 of this invention is intended to be deposited to a thickness that is sufficient to provide the required thermal protection for the underlying substrate 22 and blade 10. A suitable thickness is generally on the order of about 75 to about 300 micrometers.

However, TBC materials are susceptible to attack by CMAS. As discussed previously, CMAS is a relatively low melting eutectic that when molten is able to infiltrate columnar and porous TBC materials, and subsequently resolidify to promote spallation during thermal cycling. To reduce its vulnerability to spallation from contamination by CMAS and other potential contaminants, the TBC 26 is formed of a base ceramic material co-deposited with at least one additional ceramic material capable of interacting with CMAS. The TBC 26 shown in FIG. 5 is shown as comprising two zones—an inner layer 30 (e.g., a first layer) closer to the bond coat 24 and an outer portion 32 (e.g., a second layer) overlying the inner layer 30. As will be discussed in greater detail below, the inner layer 30 and the outer layer 32 of the TBC 26 are not discrete layers, but instead may differ in their compositions.

The compositions of the inner layer 30 and the outer layer 32 can be independently selected from ceramic compositions such that the inner layer 30 is formed from a first ceramic material and the outer layer 32 is formed from a second ceramic material. In one embodiment, the inner layer 30 and the outer layer 32 are formed of the same base ceramic material, with at least the outer layer 32 containing the additional ceramic material(s). For example, the outer layer 32 may include a ceramic material that can render the TBC 26 more resistant to infiltration by CMAS and other potential high-temperature contaminants. In terms of processing, high temperature capability and low thermal conductivity, a preferred base ceramic material for the TBC 26 is an yttria-stabilized zirconia (YSZ), such as a composition of about 3 to about 8 weight percent yttria, though other ceramic materials could be used, such as nonstabilized zirconia, or zirconia partially or fully stabilized by magnesia, ceria, scandia or other oxides. In one embodiment, the additional ceramic material(s) present in at least the outer layer 32 of the TBC 26 is capable of interacting with molten CMAS to form a compound with a melting temperature that is significantly higher than CMAS, so that the reaction product of CMAS and the ceramic material does not melt and does not infiltrate the TBC 26. Additionally, "sacrificial layer" materials are potential candidates for the additional ceramic material of these layers 30, 32. In other embodiments, the second ceramic source material of the outer layer 32 provides improved impact resistance to the underlying layers and component.

As shown in FIG. 5, a blended layer 31 is positioned between the inner layer 30 and the outer layer 32 of the TBC 26. The blended layer 31 includes, in one embodiment, a combination of the compositions of inner layers 30 and outer layers 32. For example, the blended layer 31 can be a mixture of the first and second ceramic compositions. For example, the blended layer 31 can have a graded composition extending from the inner layer 30 to the outer layer 32.

Figure 6:
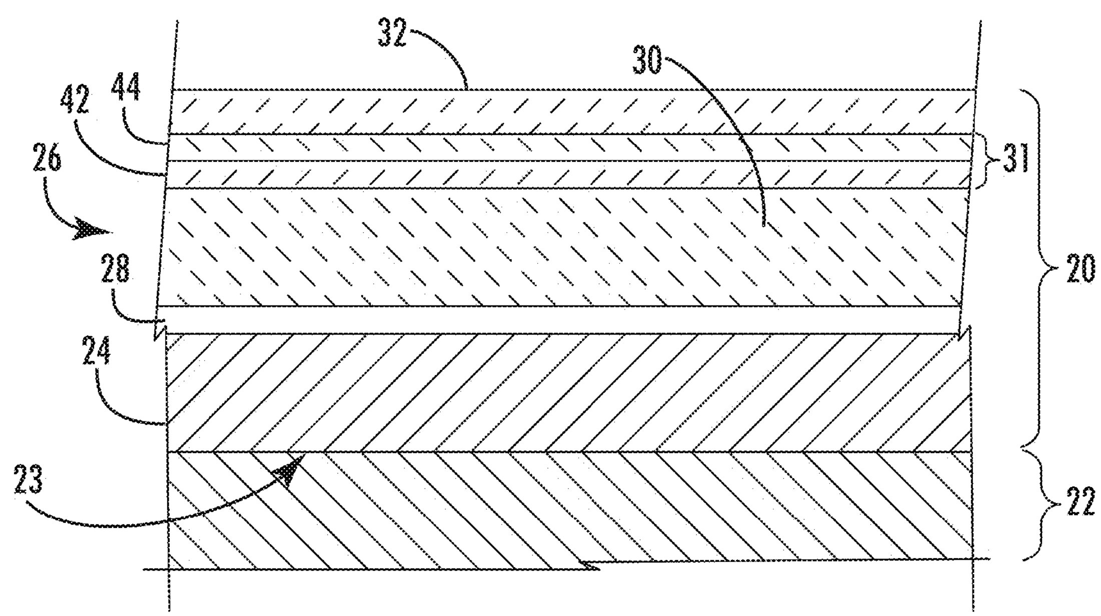
FIG. 6 shows a cross-sectional view of an exemplary granular interface between the first layer and the second layer.

In other embodiments, the blended layer 31 can have a stepped composition formed from a plurality of sub-layers (e.g., at least two sub-layers, such as about 2 to about 10 sub-layers), with each of the sub-layers having a composition that increases in concentration of the second ceramic source material as it extends away from the first layer. For example, FIG. 6 shows a blended layer 31 formed from a first blended layer 42 and a second blended layer 44. For example, after directing the energy source 68 onto the first ceramic source material 54 as shown in FIG. 1, the energy source 68 is alternated between the first ceramic source material 54 and the second ceramic source material 56 at a first alternating rate to form a first blended layer 42. Thereafter, the energy source 68 is alternated between the first ceramic source material 54 and the second ceramic source material 56 at a second alternating rate to form a second blended layer 44 such that the second blended layer 44 has a greater concentration of the second ceramic source material 56 than the first blended layer 42.

Figure 7:
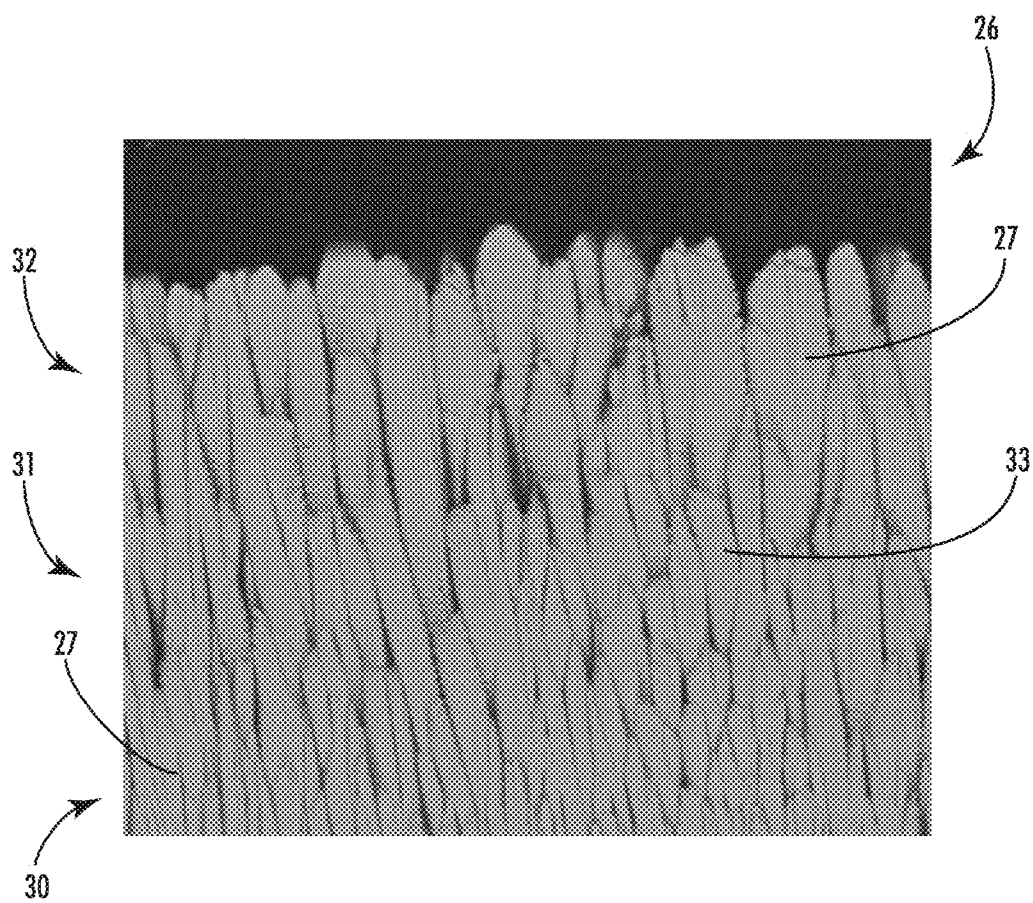
FIG. 7 shows a cross-sectional view of another exemplary granular interface between the first layer and the second layer.

Referring to FIG. 7, the inner layer 30 and the outer layer 32 of the TBC 26 is shown having a strain-tolerant microstructure of columnar grains 27. Additionally, the blended layer 31 includes columnar grains 33 that extend between the columnar grains 27 of the inner layer 30 and the outer layer 32. As such, the blended layer 31 can strengthen the interaction between the inner layer 30 and the outer layer 32.

Such columnar microstructures can be achieved by depositing the TBC 26 using a physical vapor deposition (PVD) technique, such as EBPVD, though other PVD techniques could be used such as laser beam PVD, sputtering (e.g., magnetron), ion plasma, and cathodic arc deposition. EBPVD processes generally require the presence of an evaporation source of the desired coating composition, and an electron beam at an appropriate power level to create a vapor of the evaporation source in the presence of the surface to be coated. In order to form the blended layer 31 between the inner layer 30 and the outer layer 32, multiple evaporation sources are used to deposit the TBC 26.

Figure 2:
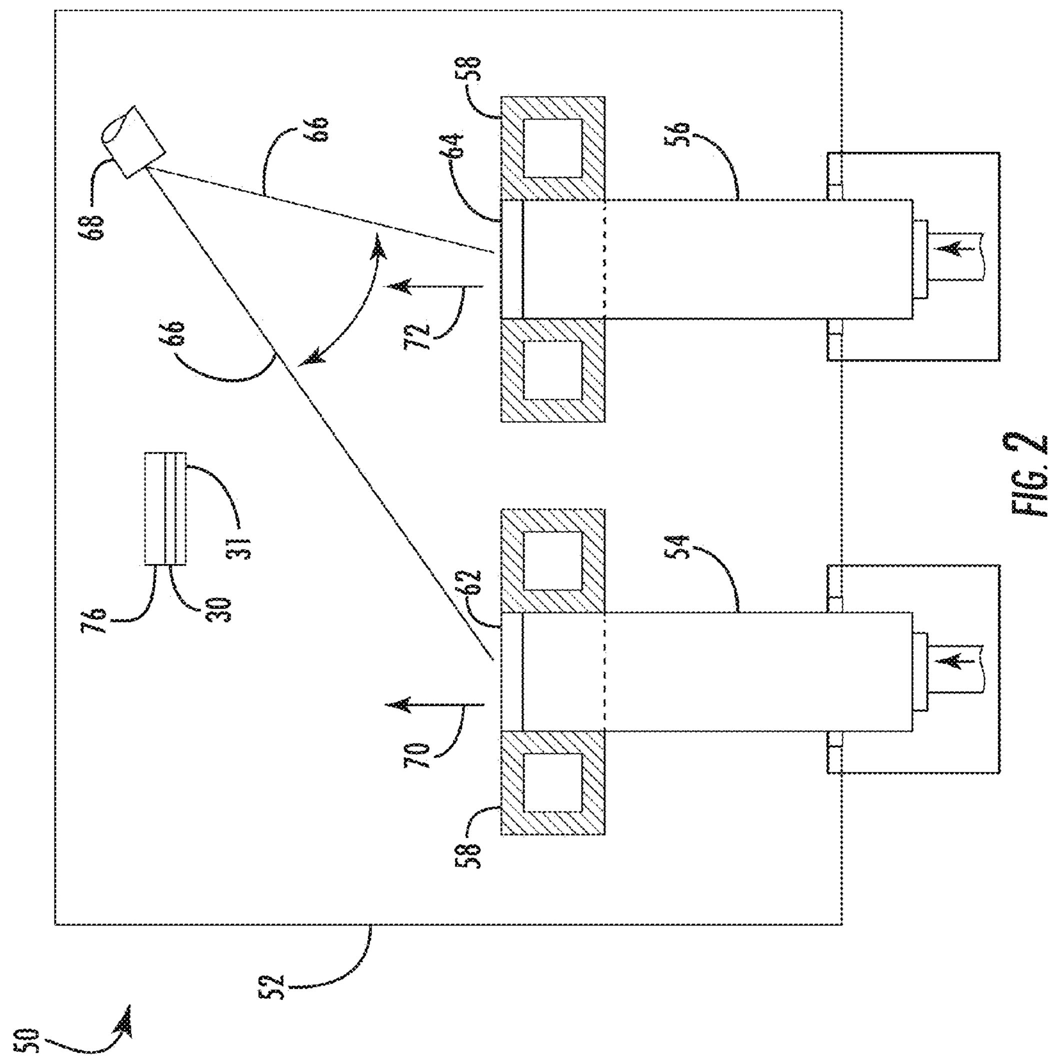
FIG. 2 shows a general schematic of a cross-sectional view of an exemplary electron beam physical vapor deposition apparatus for use in depositing a an intermediate layer of a thermal barrier coating system.
Figure 3:
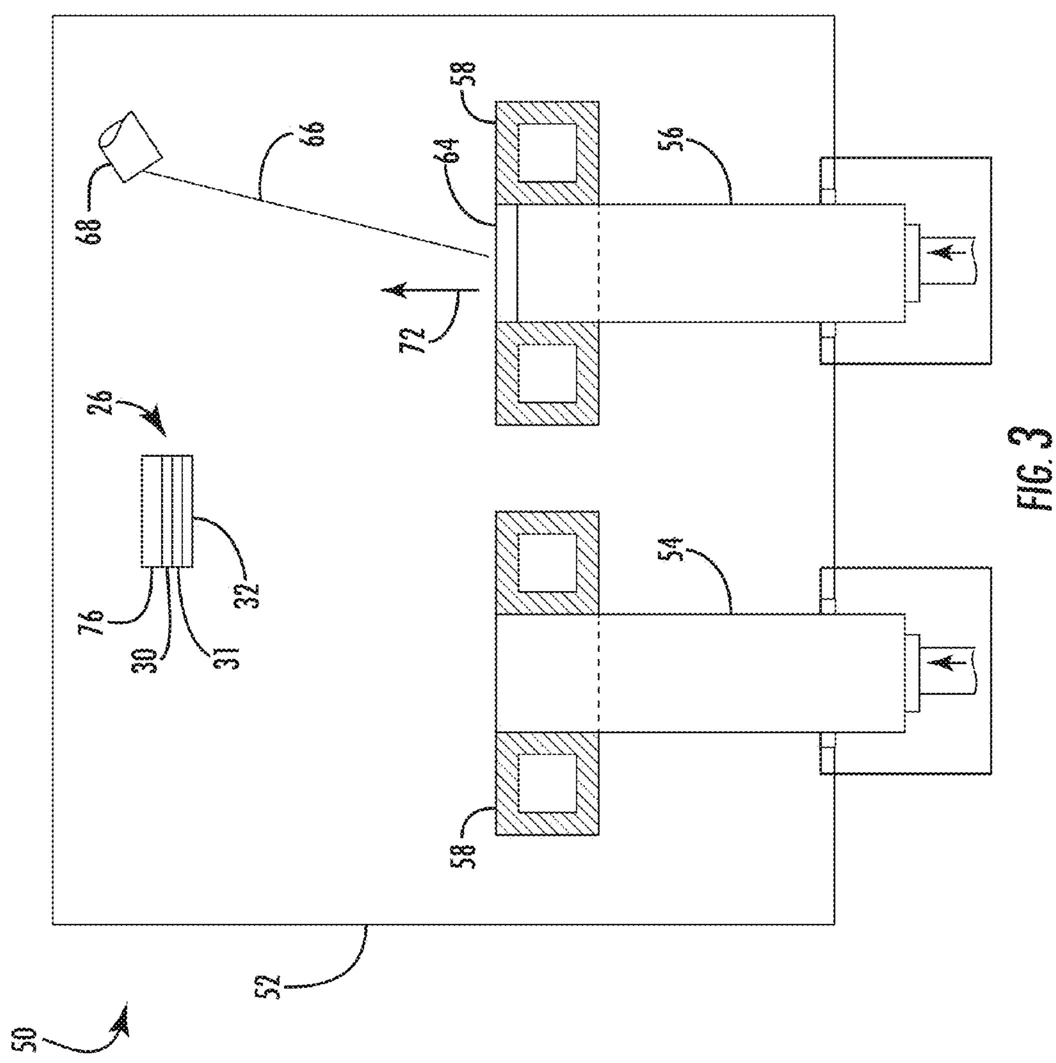
FIG. 3 shows a general schematic of a cross-sectional view of an exemplary electron beam physical vapor deposition apparatus for use in depositing a second layer of a thermal barrier coating system.

FIGS. 1-3 schematically represents an EBPVD coating apparatus 50, including a coating chamber 52 in which a component 76 is suspended for forming the TBC 26. FIG. 3 shows the TBC 26 including the inner layer 30, the blended layer 31, and the outer layer 32 formed sequentially in the coating apparatus 50 according to FIGS. 1-3. The coating apparatus 50 forms the multilayer TBC 26 through deposition on the component 76 by melting and vaporizing a first ceramic source material 54 (e.g., first ingot 54) and a second ceramic source material 56 (e.g., second ingot 56) of the desired ceramic materials with an energy source 68 with directed energy 66 (e.g., an electron beam gun 68 with an electron beam 66 or a laser source 68 produced by laser source 68).

The energy source 68 is moveable so as to direct energy 66 selectively between the first ceramic source material 54 and a second ceramic source material 56. In depositing the TBC 26 to have an inner layer 30, a blended layer 31, and an outer layer 32 with different compositions, the inner layer 30 is first deposited by evaporating only the first source 54 as shown in FIG. 1 of the first ceramic material 54 (e.g., YSZ). FIG. 1 shows the energy source 68 directing energy 66 at the first ceramic source material 54 to produce a first vapor 70 so as to form the first layer 30 on the component 76. The intensity of the beam 66 is sufficient to produce vapor cloud 70 within the coating chamber 52, and then contact and condense on the component 76 to form the inner layer 30. As shown, the vapor cloud 70 evaporates from pool 62 of the molten coating materials contained within reservoirs formed by crucibles 58 that surround the upper end of the first source 54. In particular embodiments, a suitable thickness for the inner portion 30 of the TBC 26 is on the order of about 50 to about 500 micrometers, more preferably about 75 to about 100 micrometers.

Once a desired thickness for the inner layer 30 is deposited on the component 76, the energy source 68 is alternated between the first source 54 and the second source 56 such that evaporation commences of the second source 56 as shown FIG. 2. That is, FIG. 2 shows the energy source 68 directed energy 66 alternating between the first ceramic source material 54 and the second ceramic source material 56 to produce a mixture of the first vapor 70 and the second vapor 72 so as to form the blended layer 31 on the first layer 30. Generally, the energy source 68 directed energy 66 alternating between the first ceramic source material 54 and the second ceramic source material 56 at a frequency and a power level (e.g., intensity) sufficient to produce vapor clouds 70 and 72 that mix within the coating chamber 52, which then contact and condense on the component 76 to form the blended layer 31. As shown, the vapor clouds 70 and 72 evaporate from separate pools 62 and 64, respectively, of the molten coating materials contained within reservoirs formed by crucibles 58 that surround the upper ends of the sources 54 and 56, respectively.

The blended layer 31 is formed to include the desired composition (e.g., a mixture of the first ceramic material 54 and the second ceramic material 56). In one embodiment, the energy source 68 alternates in a controlled manner so as to direct the relative amount of vapor 70, 72 within the chamber 52 so as to form a controlled composition within the blended layer 31. For example, the blended layer 31 can have a graded composition extending from the inner layer 30 to the outer layer 32 such that the composition of the blended layer 31 has a higher concentration of the first ceramic source material than the second ceramic source material at its interface with the first layer and a higher concentration of the second ceramic source material than the first ceramic source material at its interface with the second layer. Such a graded composition can gradually change though its thickness extending from the first layer to the second layer. Such a graded layer can be formed by focusing on the first ceramic source material 54 longer than the second ceramic source material 56 when beginning to deposit the blended layer, and then changing the time of focus on each of the first ceramic source material 54 and the second ceramic source material 56 as the blended layer is depositing (i.e., shortening the focus time on the first ceramic source material 54 and lengthening the second ceramic source material 56). Alternatively, the blended layer 31 can be deposited to have a uniform composition throughout its thickness from the inner layer 30 and the outer layer 32 by evaporating both sources 54, 56 simultaneously.

Finally, FIG. 3 shows the energy source 68 directing energy 66 at the second ceramic source material 56 to produce a second vapor 72 so as to form the second layer 32 on the blended layer 31. The intensity of the beam 66 is sufficient to produce vapor cloud 72 within the coating chamber 52, and then contact and condense on the component 76 to form the outer layer 32 on the blended layer 31. As shown, the vapor cloud 72 evaporates from pool 64 of the molten coating materials contained within reservoirs formed by crucibles 58 that surround the upper end of the second source 56. A suitable thickness for the outer layer 32 of the TBC 26 is about 10 to about 50 micrometers, more preferably about 10 to about 25 micrometers.

As the source materials are gradually consumed by the deposition process, the first and second source materials 54, 56 are incrementally fed into the chamber 52.

Figure 8:
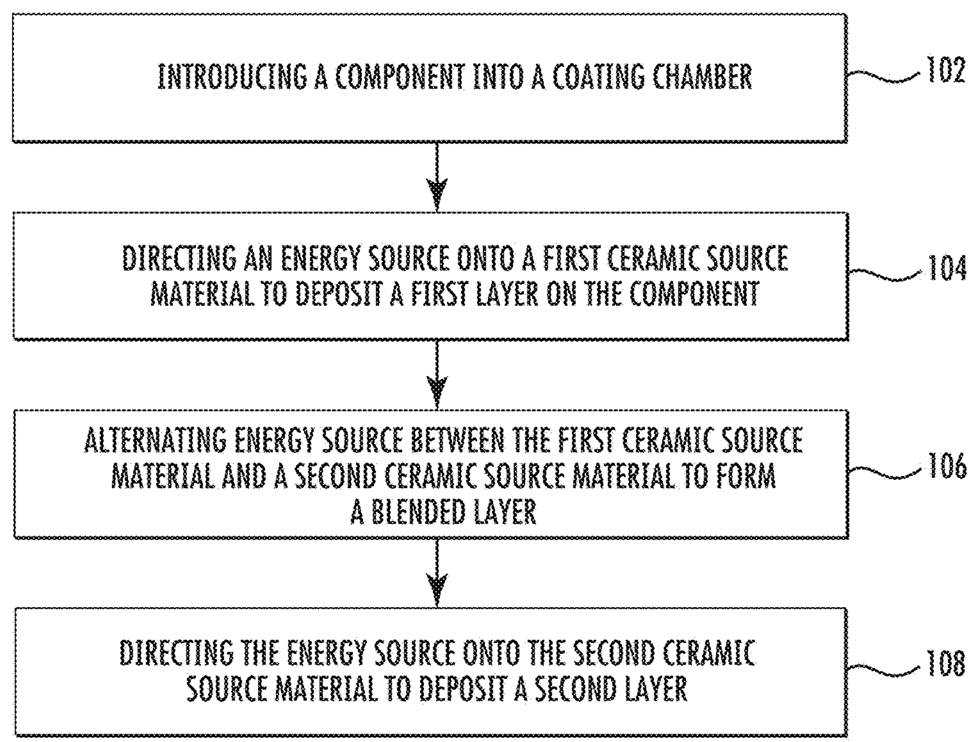
FIG. 8 shows a diagram of an exemplary method of making a thermal barrier coating system.

FIG. 8 shows a diagram of an exemplary method 100 of forming a thermal barrier coating system on a surface of a component, with the thermal barrier coating system comprising a thermal barrier coating that has columnar grains. At 102, a component is introduced into a coating chamber. For example, a first ceramic source material and a second ceramic source material can be positioned within the coating chamber (e.g., of a physical vapor deposition apparatus). At 104, an energy source is onto the first ceramic source material to vaporize the first ceramic source material to deposit a first layer on the component. At 106, the energy source is alternated between the first ceramic source material and the second ceramic source material to form a blended layer on the first layer. At 108, the energy source is directed onto the second ceramic source material to vaporize the second ceramic source material to deposit a second layer on the blended layer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of forming a thermal barrier coating system on a surface of a component, the thermal barrier coating system comprising a thermal barrier coating that has columnar grains, the method comprising:

introducing the component into a coating chamber, wherein a first ceramic source material and a second ceramic source material are positioned within the coating chamber of a physical vapor deposition apparatus;

directing an energy source in the form of a laser onto the first ceramic source material to vaporize the first ceramic source material to deposit a first layer on the component; and alternating the energy source between the first ceramic source material and the second ceramic source material to form a blended layer on the first layer, wherein the blended layer is formed from vapors from the first ceramic source material and the second ceramic source material, wherein the first ceramic source material and the second ceramic source material are different materials.

2. The method of claim 1, wherein the laser has a first power when directed toward the first ceramic source material, and wherein the laser has a second power when alternating the laser between the first ceramic source material and the second ceramic source material.

3. The method of claim 2, wherein the second power is higher than the first power.

4. The method of claim 1, wherein the first ceramic source material comprises yttria-stabilized zirconia.

5. The method of claim 1, wherein the second ceramic source material is configured to increase the resistance of the thermal barrier coating to infiltration by molten CMAS.

6. The method of claim 1, wherein the second ceramic source material provides improved impact resistance to the component.

7. The method of claim 1, further comprising:

depositing a bond coat on the surface of the component prior to forming the first layer.

8. A method of forming a thermal barrier coating system on a surface of a component, the thermal barrier coating system comprising a thermal barrier coating that has columnar grains, the method comprising:

introducing the component into a coating chamber, wherein a first ceramic source material and a second ceramic source material are positioned within the coating chamber of a physical vapor deposition apparatus;

directing an energy source in the form of a laser onto the first ceramic source material to vaporize the first ceramic source material to deposit a first layer on the component;

alternating the energy source between the first ceramic source material and the second ceramic source material to form a blended layer on the first layer, wherein the blended layer is formed from vapors from the first ceramic source material and the second ceramic source material; and directing the laser onto the second ceramic source material to vaporize the second ceramic source material to deposit a second layer on the first layer.

* * * * *